United States Patent
Haverkamp et al.

(12) 
(10) Patent No.: US 6,622,272 B1
(45) Date of Patent: Sep. 16, 2003

(54) AUTOMATIC TEST EQUIPMENT METHODS AND APPARATUS FOR INTERFACING WITH AN EXTERNAL DEVICE

(75) Inventors: Bernhard K. Haverkamp, Martinez, CA (US); Lik Seng Lim, Clayton, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/523,431

(22) Filed: Mar. 10, 2000

(51) Int. Cl.$^7$ ............................................... G01R 31/28
(52) U.S. Cl. ........................................ 714/725; 714/724
(58) Field of Search .............................. 714/725, 724, 714/736, 730, 763

(56) References Cited

U.S. PATENT DOCUMENTS

| | | | |
|---|---|---|---|
| 4,354,268 A | * 10/1982 | Michel et al. | |
| RE31,828 E | 2/1985 | Raymond et al. | ............. 371/20 |
| 4,500,993 A | 2/1985 | Jacobson | ..................... 371/16 |
| 6,453,435 B1 | * 9/2002 | Limon, Jr. et al. | .......... 714/724 |
| 6,460,152 B1 | * 10/2002 | Demidov et al. | ........... 714/723 |

* cited by examiner

Primary Examiner—Phung M. Chung
(74) Attorney, Agent, or Firm—Chapin & Huang, L.L.C.; David E. Huang, Esq.

(57) ABSTRACT

The invention is directed to techniques for accessing an external device, e.g., a device under test (DUT), from an automatic test equipment (ATE) interfacing apparatus, e.g., a specialized tester or channel card device. In one arrangement, the ATE interfacing apparatus includes a test bus interface for connecting to a test bus of an automatic test system; an external device interface for connecting to an external device; and a translator, interconnected between the test bus interface and the external device interface. The translator receives a memory access instruction from the test bus through the test bus interface. The memory access instruction includes a command and a test bus address. The translator translates the test bus address into an identifier which identifies a portion of the external device, and accesses the identified portion of the external device through the external device interface based on the command and the identifier. Translation of the test bus address into the identifier, and accessing the external device based on the command of the instruction and the identifier alleviate the need for the ATE interfacing apparatus to receive lower level instructions and data from an ATE controller. Accordingly, less time is needed to configure the ATE interfacing apparatus through the test bus resulting in greater overall programming and/or test times and enhanced throughput.

26 Claims, 8 Drawing Sheets

AUTOMATIC TEST EQUIPMENT METHODS AND APPARATUS FOR INTERFACING WITH AN EXTERNAL DEVICE

BACKGROUND OF THE INVENTION

In general, automatic test equipment (ATE) is equipment for testing electronic devices such as circuit boards or integrated circuits (ICs) in an automated manner. When an ATE system tests such a device (commonly referred to as the device under test or DUT), the ATE system typically applies stimuli such as electrical signals (e.g., voltages and/or currents) to the DUT and checks responses of the DUT. Typically, the end result of a test is either "pass" if the DUT successfully provides certain expected responses within pre-established tolerances, or "fail" if the DUT does not provide the expected responses within the pre-established tolerances. More sophisticated ATE systems are capable of evaluating a failed DUT to potentially determine one or more causes of a failure.

Some ATE systems can program and test bus-oriented components of a DUT. Programming DUT components customizes the DUT for its intended application. One such ATE system includes a controller, an input/output (I/O) interface, a tester and a bed of nails. Typically, the controller is a workstation or a personal computer (PC), and the tester is a channel card having multiple channels that enable the channel card to simultaneously provide and record multiple signals. The I/O interface typically connects the controller with the tester. Similarly, the bed of nails typically connects the tester with the DUT.

During operation, the controller sends numerous low level instructions and data to the tester through the I/O interface in order to configure the tester to program and test a specific bus-oriented component of the DUT. In particular, the controller provides signal generating data (e.g., signal sequences, voltage settings, voltage application time lengths, etc.), switch settings which control which portions of the bed of nails will be used during programming and testing, and test parameters such as those which define the length of the test and clock frequencies.

Once the controller has configured the tester through the I/O interface, the controller sends a special command to the tester, through the I/O interface, to begin programming and testing the specific bus-oriented DUT component. In response, channel circuitry within the tester generates signals having particular characteristics in accordance with the signal generating data. Furthermore, channel switches within the tester operate to route these signals to proper locations. As a result, the tester simulates one or more memory access cycles (e.g., FETCH, READ, WRITE, RESET, etc.) to program and test the bus-oriented DUT component.

Upon completion of the test, the tester provides recorded signal samples to the controller, through the I/O interface, for further processing (e.g., for a comparison with an expected response).

After the tester of the ATE system has completed testing of the bus-oriented component and has provided the results to the controller, the controller can reconfigure the tester to program and test another component of the DUT (e.g., another bus-oriented DUT component). To this end, the controller provides, through the I/O interface, new signal generating data, new switch settings and new test parameters which configure the tester to appropriately program and test the new DUT component. After testing of the new component is complete, the tester again sends the recorded signal samples to the controller, through the I/O interface, for further processing. The controller can repeat this process for other DUT components until the DUT is fully tested.

An ATE system which is similar to the above-described ATE system is described in U.S. Pat. No. 4,500,993 entitled "In-Circuit Tester for Testing Microprocessor Boards," (Jacobson), the entire teachings of which are hereby incorporated by reference in their entirety. Another similar ATE system is described in Reissued U.S. Pat. No. RE 31,828 entitled "In-Circuit Digital Tester," (Raymond et al.), the entire teachings of which are hereby incorporated by reference in their entirety.

SUMMARY OF THE INVENTION

In some conventional ATE systems a controller (i) configures a tester to program and test bus-oriented DUT components (as well as other DUT components), and (ii) receives recorded test results from the tester for further processing. In particular, for each component of the DUT to be tested, the controller typically provides numerous low level instructions and data such as signal generating data (e.g., voltage settings, voltage application time lengths, etc.), numerous switch settings, and test parameters to the tester through the I/O interface. Once the controller configures the tester using this information, the controller commands the tester to begin programming and testing that DUT component by sending a special command to the tester through the I/O interface. In response, the tester uses the instructions and data from the controller to properly generate signals and to properly operate the bed of nails which couples the tester to the DUT. At the end of each test, the tester typically returns recorded DUT component signal samples to the controller through the I/O interface for further processing.

Unfortunately, the data transfer rate between the controller and the tester, through the I/O interface, is often slower than the data transfer rate between the tester and the DUT, through the bed of nails. That is, more time is often required for the controller to configure the tester through the I/O interface, than for the tester to perform a programming and/or testing procedure on the DUT. Furthermore, upon completion of a test, additional time is required to transfer recorded test samples from the tester to the controller through the I/O interface for further processing. Such operation is essentially a bottleneck of the ATE system. That is, the numerous low level instructions and data passed between the controller and the tester for each DUT component test limits the overall throughput, i.e., programming and testing speed, of the ATE system.

In contrast to the above-described conventional ATE systems which require extensive use of the I/O interface to transfer numerous items of information (i.e., low level instructions, switch settings, sampled data, etc.) between the controller and the tester, the invention is directed to techniques for accessing an external device, e.g., programming and/or testing a DUT, using higher level memory access instructions between an ATE controller and an ATE interfacing apparatus, e.g., a specialized tester or channel card device. The use of such higher level instructions results in optimized communications between the ATE controller and ATE interfacing apparatus, and shorter overall programming and test times. Accordingly, the invention provides greater throughput over conventional ATE systems.

Furthermore, the use of higher level instructions enables ATE program and test developers to more easily develop ATE programming and testing procedures. For example, rather than require the developer to provide step-by-step details of the programming operation (i.e., numerous low level instructions), the developer can provide a few higher level instructions.

One arrangement of the invention is directed to an ATE system having a controller that provides a memory access instruction having a command and a test bus address; an interfacing apparatus (e.g., a specialized tester or channel card device) for accessing an external device (e.g., a DUT); and a test bus which connects the controller with the interfacing apparatus. The interfacing apparatus (i) receives the memory access instruction from the controller through the test bus, (ii) translates the test bus address into an identifier which identifies a portion of the external device, and (iii) accesses the identified portion of the external device based on the command and the identifier. Translation of the test bus address into the identifier, and accessing the external device based on the command of the instruction and the identifier alleviate the need for the ATE interfacing apparatus to receive numerous low level instructions and data. Accordingly, less time is needed to configure the interfacing apparatus through the test bus.

In another arrangement of the invention, an ATE interfacing apparatus has a test bus interface for connecting to a test bus of an ATE system (e.g., to a VXI bus); an external device interface for connecting to an external device; and a translator, interconnected between the test bus interface and the external device interface. The translator receives a memory access instruction from the test bus through the test bus interface. The memory access instruction includes a command and a test bus address. The translator translates the test bus address into an identifier which identifies a portion of the external device, and accesses the identified portion of the external device through the external device interface based on the command and the identifier.

In one arrangement, a memory address space of the ATE system includes a local memory address space for addressing memory locations of a local memory of the ATE system and an external device address space that is outside the local memory address space. Here, the translator is configured to determine whether the test bus address of the memory access instruction is within the external device address space prior to accessing the external device. If so, the translator translates the test bus address into an identifier and accesses the external device based on the identifier. If not, the translator does not access the external device based on the identifier. This arrangement enables ATE program and test procedure developers to use standard memory access instructions to access the external device as if the external device were part of local memory of the ATE system. Such tightly coupling is achieved by ability of the ATE interfacing apparatus to determine whether a particular memory access instruction is intended to access the external device (e.g., FLASH memory of a DUT) or part of the ATE system (e.g., local memory within an ATE controller).

In one arrangement, the external device interface is connectable to an external device bus of the external device (e.g., a PCI bus on a DUT). In this arrangement, the translator preferably includes an address sequencer that generates, as the identifier which identifies the portion of the external device, an external device bus address based on the test bus address. The external device bus address identifies (or addresses) a memory location of the external device. Accordingly, the ATE interfacing apparatus can access the external device using one or more external device instructions (e.g., READ, WRITE, etc.).

In one arrangement, the memory access instruction further includes data and the external device interface is connectable to an external device bus of the external device. In this arrangement, when the external device bus has a width that is different than that of the test bus, a data sequencer in the translator maps the data of the memory access instruction into a number of external device bus cycles that is different than a number of test bus cycles conveying the data to the automatic test equipment interfacing apparatus. Accordingly, if the test bus and the external device bus are different widths, the ATE interfacing apparatus can optimize data transfers by reformatting the data into an efficient number of bus cycles during data transfer.

In one arrangement, the memory access instruction further includes data and the translator selectively operates in one of a programming mode and a test mode. Here, the translator handles a WRITE command by writing the data into a memory location of the external device when the translator operates in the programming mode. However, the translator handles the WRITE command by reading data from a memory location of the external device and comparing the read data to the data of the memory access instruction when the translator operates in the test mode. This feature enables the ATE interfacing apparatus to program (e.g., write) or test (e.g., read and compare) in response to WRITE commands which generally require less bus bandwidth than READ instructions. Accordingly, programming and testing speeds are improved and throughput is enhanced.

In the above-described arrangement, the translator preferably includes an interrupt generator that generates an interrupt signal to a controller of the ATE system through the test interface when the read data from the memory location of the external device and the data of the memory access instruction are different. Accordingly, the ATE interfacing apparatus can notify the controller that data read from the external device does not match data or the memory access instruction, e.g., expected data, perhaps due to an error.

In one arrangement, the external device includes an external device bus, and the translator is configured to access the identified portion of the external device by (i) providing, on the external device bus, an external device instruction having an external device bus address as the identifier, and (ii) selectively providing at least one supplemental external device instruction to the external device on the external device bus based on the command of the memory access instruction. This feature is useful for programming particular types of devices which require more than one external device bus cycle for proper operation. For example, many older FLASH devices require an additional set of bus cycles called an "unlock sequence" prior to executing a write cycle to program an address. The translator of the ATE interfacing device is configured to selectively provide additional cycles (i.e., supplemental external device instructions) as necessary to accommodate such devices. This alleviates the need for an ATE controller to provide more than a single memory access instruction when programming a device.

In one arrangement, the memory access instruction includes exactly one test bus address and further includes a block of data which the translator, in response to the memory access instruction, (i) receives from the test bus over multiple test bus cycles, and (ii) provides to the external device. This enables the ATE interfacing apparatus to take advantage of a test bus with block transfer mode capabilities. That is, an ATE controller can provide a block of data to the ATE interfacing apparatus using a block transfer mode WRITE instruction, and the ATE interfacing apparatus will respond by properly receiving the block of data and writing it to the external device.

In one arrangement, the test bus interface, the translator and the external device bus interface operate in a pipeline manner to process multiple memory access instructions simultaneously. Accordingly, the ATE interfacing apparatus can handle multiple memory access instructions at the same time similar to many pipelined processing devices. Upon detection of an error, the ATE interfacing apparatus is configured to properly handle the error prior to "backing up" and restarting the pipeline at a safe point.

In one arrangement, the ATE interfacing apparatus further includes a library of translation routines. The translator is configured to dynamically select among the translation routines of the library when processing multiple memory access instructions in order to access different portions of the external device in different manners. Accordingly, the ATE interfacing apparatus is equipped to program and test many different types of devices without the need to incrementally obtain numerous low level instructions and data from the ATE controller each time the ATE interfacing apparatus begins programming and testing of a different device.

Another arrangement is directed to a computer program product that includes a computer readable medium having code stored thereon for processing a memory access instruction. The code, when carried out by an interfacing device of an ATE system having a test bus coupled to the interfacing device, causes the interfacing device to perform the steps of: (a) receiving a memory access instruction having a command and a test bus address; (b) translating the test bus address into an identifier which identifies a portion of an external device; and (c) accessing the identified portion of the external device based on the command and the identifier. Such code can be bundled with an operating system of the ATE system for convenience, or provided separately.

The features of the invention, as described above, may be employed in an ATE system and other related devices such as those manufactured by Teradyne, Inc. of Boston, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for accessing an external device, e.g., programming and/or testing a device under test (DUT), using memory access instructions between an automatic test equipment (ATE) controller and an ATE interfacing apparatus, e.g., a specialized tester or channel card device. The use of such instructions results in only a few instructions and data exchanged between the ATE controller and ATE interfacing apparatus, and short overall programming and test times. Accordingly, the invention provides greater throughput over conventional ATE systems which are often bottlenecked by numerous low level instructions and data exchanged between an ATE controller and a tester or channel card. Furthermore, the use of memory access instructions enables ATE program and test developers to more easily develop ATE programming and testing procedures. For example, rather than require the developer to provide step-by-step details of the programming operation, the developer can provide fewer higher level instructions. Such techniques may be employed in ATE systems and other related devices such as those manufactured by Teradyne, Inc. of Boston, Mass.

Figure 1:
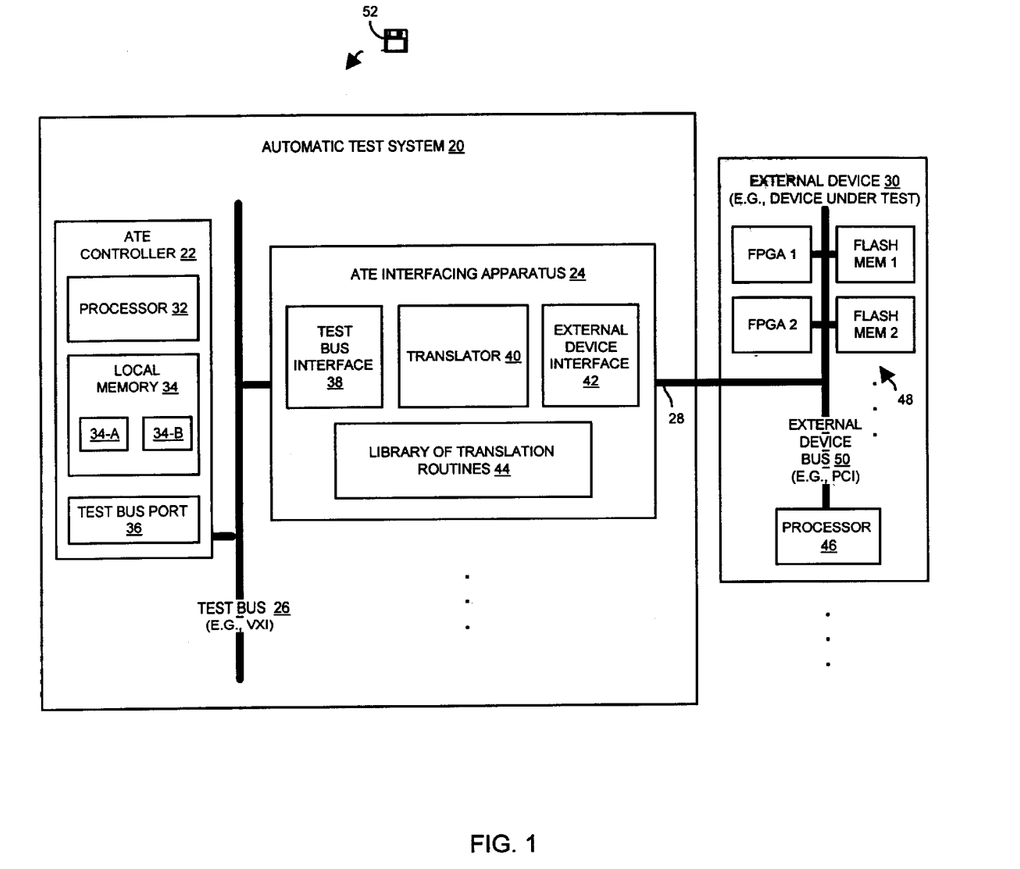
FIG. 1 shows a block diagram of an ATE system for testing an external device using translated test bus addresses.

FIG. 1 shows an ATE system 20 which is suitable for use by the invention. The ATE system 20 includes an ATE controller 22, an ATE interfacing apparatus 24, a test bus 26 which connects the ATE controller 22 with the ATE interfacing apparatus 24 (e.g., a VXI bus), and an external coupler 28 (e.g., a bed of nails) for connecting the ATE interfacing apparatus 24 to an external device 28 (e.g., a DUT).

The ATE controller 22 includes a processor 32, a local memory 34 and a test bus port 36. The processor 32 operates in accordance with memory constructs within the local memory 34 such as an operating system 34-A and an ATE application 34-B. The test bus port 36 enables the ATE controller 22 to send signals to and receive signals from the test bus 26.

The ATE interfacing apparatus 24 includes a test bus interface 38, a translator 40, an external device interface 42, and a library of translation routines 44. The test bus interface 38 enables the ATE interfacing apparatus 24 to send signals to and receive signals from the test bus 26. Similarly, the external bus interface 42 enables the ATE interfacing apparatus 24 to send signals to and receive signals from the external device 30 through the external coupler 28. The translator 40 processes memory access instructions from the ATE controller 22 in accordance with one or more routines from the library of routines 44. In particular, the translator 40 receives memory access instructions from the ATE controller 22 over the test bus 26, and determines whether the memory access instructions are directed to the ATE interfacing apparatus 24 for processing. If the ATE interfacing apparatus 24 determines that a particular memory access instruction is not directed to the ATE interfacing apparatus 24, the ATE interfacing apparatus 24 does not respond to the instruction by accessing the external device 30. However, if the ATE interfacing apparatus 24 determines that the particular memory access instruction is directed to the ATE interfacing apparatus 24, the ATE interfacing apparatus 24 accesses the external device 30 in response thereto.

By way of example only, FIG. 1 shows some portions of an external device 30 (e.g., a DUT) which are accessible by the ATE interfacing apparatus 24. In this example, the external device 30 includes a processor 46 and a set 48 of bus-oriented components, e.g., field programmable gate array devices (FPGAs) and FLASH programmable memories. The external coupler 28 connects the ATE interfacing apparatus 24 to these external device portions through an external device bus 50 of the external device 30 (e.g., a PCI bus).

In one arrangement, the ATE interfacing apparatus 24 includes a processor which operates in accordance with specialized code to form various internal components (e.g., the translator 40). In this arrangement, a computer program product 52 (e.g., one or more CDROMs, tapes, diskettes, etc.) initially provides this code to the ATE interfacing apparatus 52. For example, the code from the computer program product 52 can be read by the ATE controller 22 and conveyed to the ATE interfacing apparatus 24 prior to shipping the ATE system 20 from the manufacturer. Alternatively, a specialized device (not shown) may convey the code to the ATE interfacing apparatus 24, e.g., via a network download.

In an alternative arrangement, the components of the ATE interfacing apparatus 24 are formed by hardware components, e.g., by application specific integrated circuits (ASICs), or combinations thereof (e.g., part processor, part ASIC), etc.

Figure 2:
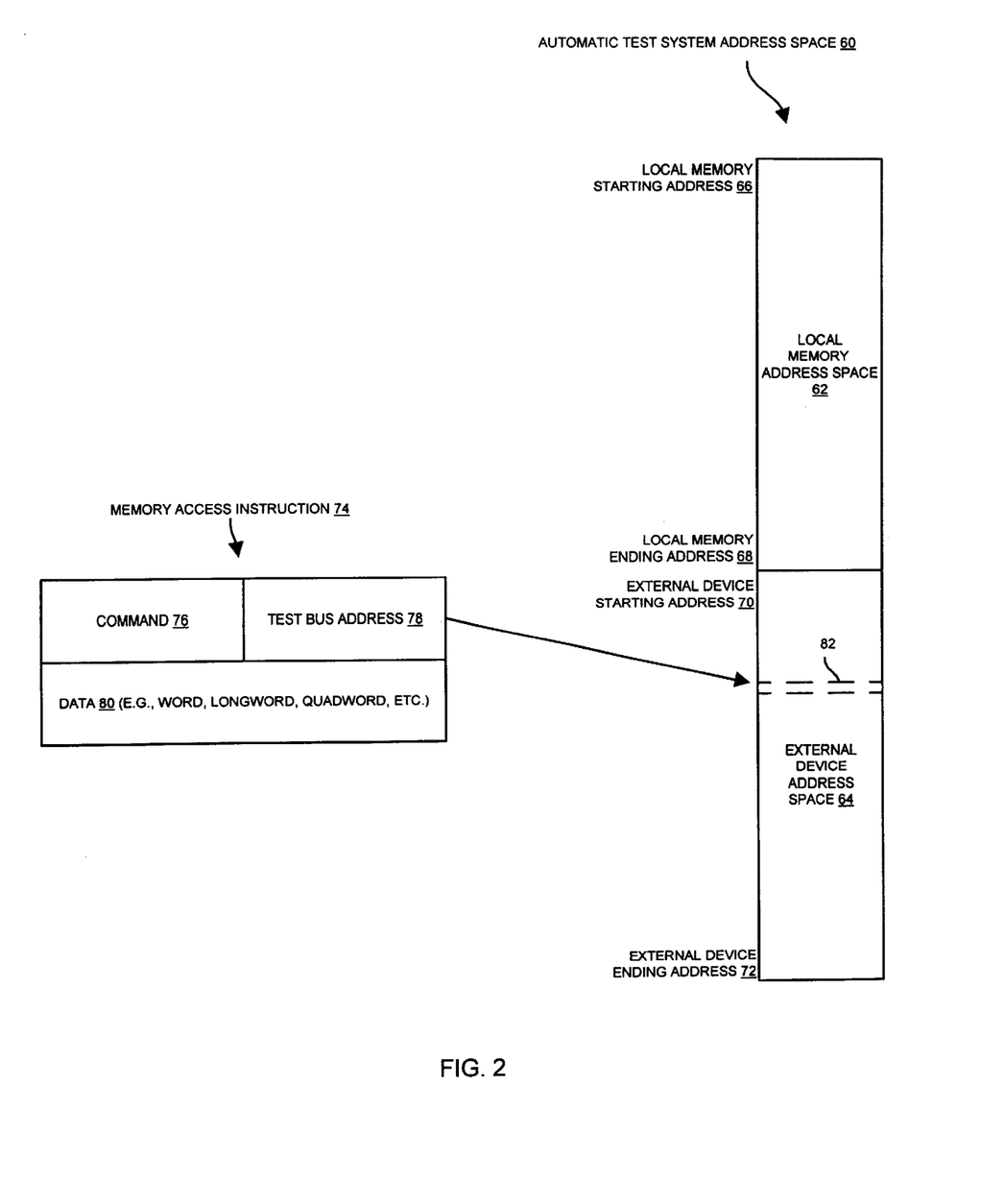
FIG. 2 shows a block diagram of an ATE system address space including a local memory address range corresponding to a local memory of the automatic test system of FIG. 1, and an external device address range corresponding to accessible locations of the external device of FIG. 1.

FIG. 2 shows an address space 60 which is suitable for use by the ATE controller 22. The address space 60 includes a local memory address space 62 and an external device address space 64. A local memory starting address 66 and a local memory ending address 68 define the local memory address space 62. Similarly, an external device starting address 70 and an external device ending address 72 define the external device address space 64. Addresses within the local memory address space 62 correspond to memory locations within the local memory 34 and within the ATE interfacing apparatus 24. In a similar manner, addresses within the external device address space 64 correspond to portions of the external device 30.

FIG. 2 further shows a memory access instruction 74 which is suitable for use by the invention. The memory access instruction 74 includes a command 76, a test bus address 78 and data 80. Interpretation of the data 80 depends on the command 76. For example, the data 80 may include padding if the size of the data 80 (e.g., word, longword, etc.) is smaller than the width of the test bus 26 (also see FIG. 1). By way of example only, the memory access instruction 74 is shown as requiring at least two test bus cycles: one cycle for the command 76 and the test bus address 78, and another cycle for the data 80. As shown in FIG. 2, the test bus address 78 identifies an address location 82 of the external device address space 64.

It should be understood that the memory access instruction 74 which identifies a location within the external device address space 64 is used by the ATE interfacing apparatus 24 as an instruction to access the external device 30. As such, a READ or WRITE memory access instruction 74 from the ATE controller 22 can be translated by the ATE interfacing apparatus 24 directly into a READ or WRITE external device instruction on the external device 30. Such tight coupling allows the ATE controller 22 to access the ATE interfacing apparatus 24 as if the ATE controller 22 were accessing its local memory 34 without slowing down, or bottlenecking a programming or testing procedure. Furthermore, ATE program and test developers can develop new procedures more easily using READ and WRITE instructions rather than conventional low level instructions.

Figure 3:
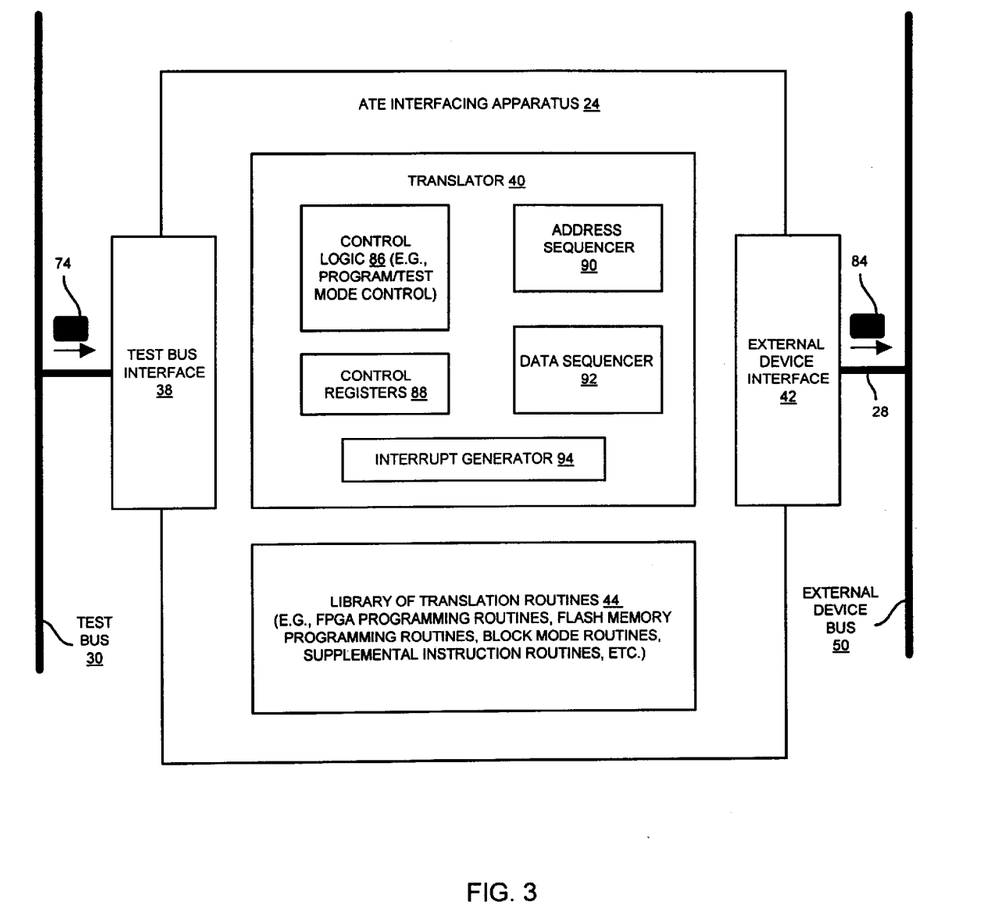
FIG. 3 shows a block diagram of a translator of the interfacing apparatus of FIG. 1.

FIG. 3 shows further details of the ATE interfacing apparatus 24. As described earlier, the ATE interfacing apparatus 24 includes a test bus interface 38 for connecting to the test bus 30 (e.g., a VXI bus) of the ATE system 20, and an external device interface 42 for connecting to the external device 30. In one arrangement, the external device interface 42 connects with an external device bus 50 (e.g., a PCI bus) of the external device (e.g., through a bed of nails, a bus adaptor, a cable/connector assembly, etc.).

The ATE interfacing apparatus 24 further includes a translator 40 and a library of translation routines 44 which provides direction as to how the translator 40 should translate memory access instructions 74 received from the test bus 30. In one arrangement, the library 44 includes a selection of routines for accessing different types of DUT components (e.g., FPGA programming routines, FLASH memory programming routines, supplemental instruction routines, etc.).

As shown in FIG. 3, the translator 40 includes control logic 86, control registers 88, an address sequencer 90, a data sequencer 92, and an interrupt generator 94. One function of the control logic 86 is to operate based on settings within the control registers 88 to determine whether memory access instructions 74 from the test bus 30 (e.g., originating from the ATE controller 22, see FIG. 1) are intended to access the external device 30. In one arrangement, the ATE interfacing apparatus 24 selectively operates in a particular mode such as in a programming mode or in a testing mode. This mode of operation is determined by the settings within the control registers 88 (e.g., one or more bits). The ATE controller 22 can change these settings by writing directly to the control registers 88, e.g., to a location within the local memory address space 62 (see FIG. 2). The control logic 86 directs the address and data sequencers 90, 92 to use particular routines of the library 44. The ATE controller 22 can change the operation of the control logic 86 by setting bits of the control registers 88 as well. The interrupt generator 94 sends an interrupt to the ATE controller 22 if it detects a failure during a particular programming or test procedure.

Figure 4:
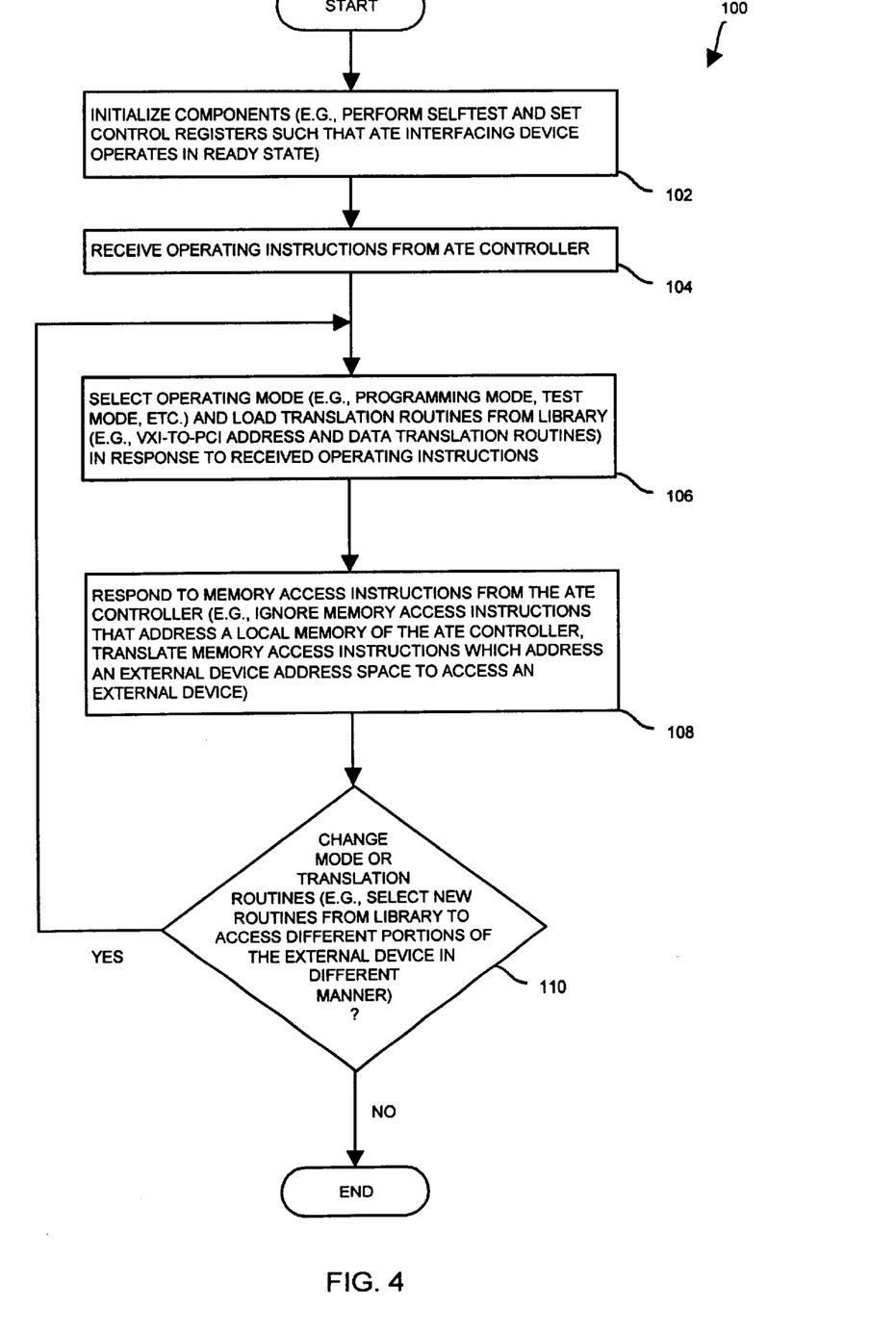
FIG. 4 shows a flow chart of a procedure for testing an external device which is performed by the interfacing apparatus of FIG. 1.

The operation of the ATE interfacing apparatus 24 will now be described in further detail with reference to FIGS. 4 and 5. FIG. 4 shows a procedure 100 which is performed by the ATE interfacing apparatus 24. In step 102, the ATE interfacing apparatus 24 initializes particular components. In particular, the ATE interfacing apparatus 24 (i) performs a selftest and, if the ATE interfacing apparatus 24 passes the selftest, (ii) sets the contents of the control registers 88 such that ATE interfacing apparatus 24 enters a ready state, i.e., ready to respond to instructions from the ATE controller 22.

In step 104, the ATE interfacing apparatus 24 receives operating instructions from the ATE controller 22. In particular, the ATE controller 22 adjusts the control registers 88 to configure the ATE interfacing apparatus 24 to access a particular type of external device component in response to memory access instructions 74 which address the external device address space 64. For example, the contents of the registers 88 identify an operating mode, the external device address space 64, translation routines, etc.

In step 106, the ATE interfacing apparatus 24 responds to the adjustments to the control registers 88 by selecting an operating mode (e.g., programming mode or testing mode), and configuring the address and data sequencers to operate in accordance with particular translation routines of the library 44. By way of example only, the contents of the control registers 88 can configure the address and data sequencers 90, 92 with translation routines that enable the ATE interfacing apparatus 24 to generate PCI bus instructions for accessing FPGA devices on the external device 30.

In step 108, the ATE interfacing apparatus 24 responds to one or more memory access instructions 74 from the ATE controller 22. In particular, the ATE interfacing apparatus 24 translates test bus addresses, which are directed to the external device address space 64, into identifiers that identify portions of the external device 30 and then accesses those portions (e.g., reads or writes data to those portions). However, the ATE interfacing apparatus 24 ignores memory access instructions 74 which have test bus addresses directed to the local memory address space 62. In general, the ATE interfacing apparatus 24 will be writing (programming) data onto the external device when the device is in programming mode, and reading and comparing data when the device is in test mode. However, it should be understood that the ATE interfacing apparatus 24 is capable of reading or writing in either mode.

Figure 5:
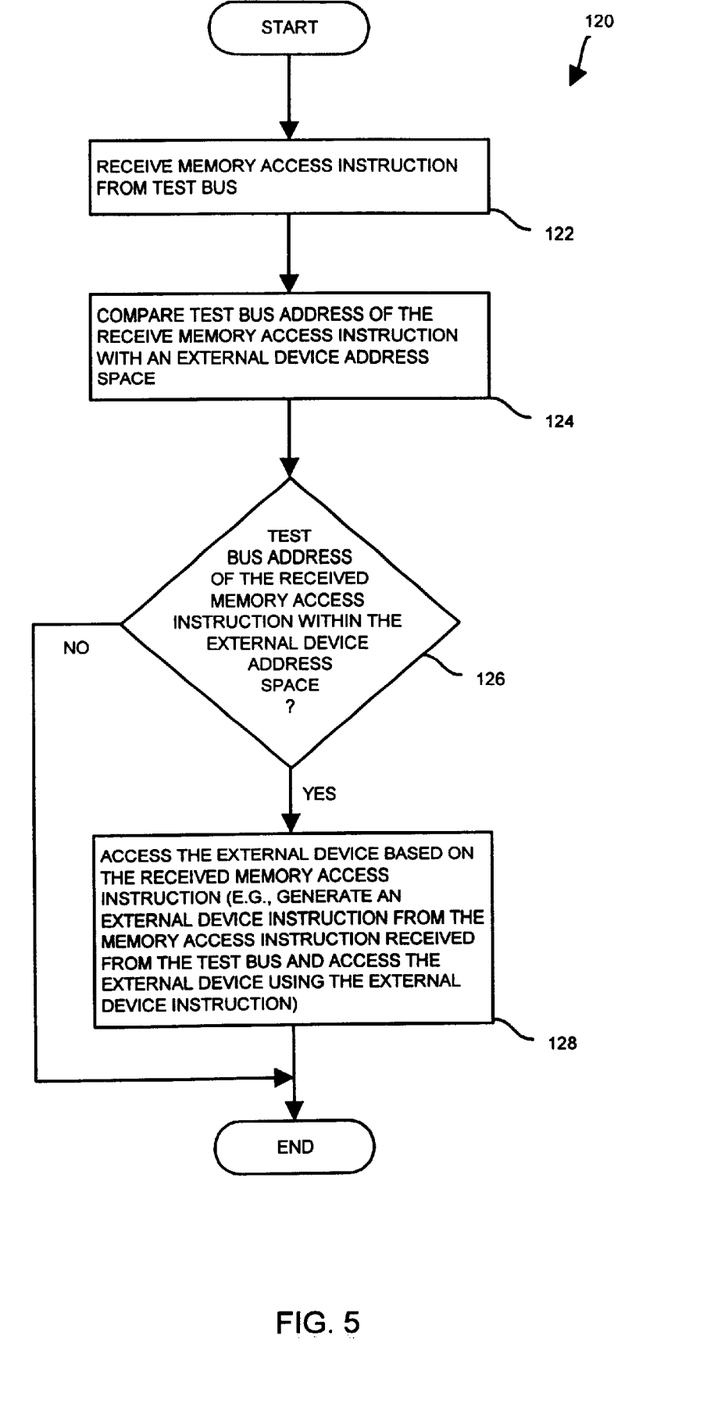
FIG. 5 shows a flow chart of a procedure for responding to memory access instructions as part of the procedure of FIG. 4.

Further details of how the ATE interfacing apparatus 24 generates identifiers from memory access instructions 74 will be provided shortly with respect to FIG. 5. With respect to step 108 of FIG. 4, the ATE controller 22 (e.g., under direction of the application 34-B) may provide multiple memory access instructions 74 to fully program a particular component or components of the external device 30 with code.

In step 110 and still referring to FIG. 4, the ATE interfacing apparatus 24 determines whether any operation changes are required. For example, after all of the FPGAs of the external device 30 have been fully programmed, the ATE controller 22 may adjust the contents of the control registers 88 to reconfigure the ATE interfacing apparatus 24 with new translation routines to access FLASH memory devices of the external device 30. As another example, the ATE controller 22 could change the operating mode of the ATE interfacing apparatus 24 from programming mode to testing mode. If a change is required, step 110 proceeds to step 106 to make the required changes. If no change is required, programming and testing are complete and the procedure 100 terminates.

It should be understood that the ATE interfacing apparatus 24 does not access the external device 30 in response to all memory access instructions 74. Rather, the ATE interfacing apparatus 24 accesses the external device in response to only those memory access instructions 74 which address the external device address space 64.

FIG. 5 shows a procedure 120 for determining whether to access the external device 30 in response to a memory access instruction 74, which is suitable for use as at least part of step 108 of FIG. 4. In step 122, the translator 40 of the ATE interfacing apparatus 24 receives a memory access instruction 74 from the test bus 26 through the test bus interface 38.

In step 124, the control logic 86 of the translator 40 compares the test bus address 78 of the memory access instruction 74 to the external device address space 64 (e.g., by comparing the test bus address portion 78 with the external device starting and ending addresses 70, 72).

In step 126, if the test bus address 78 of the memory address instruction 74 does not reside in the external device address space 64, the control logic 86 does not access the external device and the procedure 120 terminates. However, if the test bus address 78 resides in the external device address space 64, the control logic 86 accesses the external device 30 based on the memory access instruction 74 (e.g., based on the command 76 and the test bus address 78). Accordingly, the ATE interfacing apparatus 24 accesses the external device 30 only in response to those memory access instructions 74 which address the external device address space 64.

Figure 6:
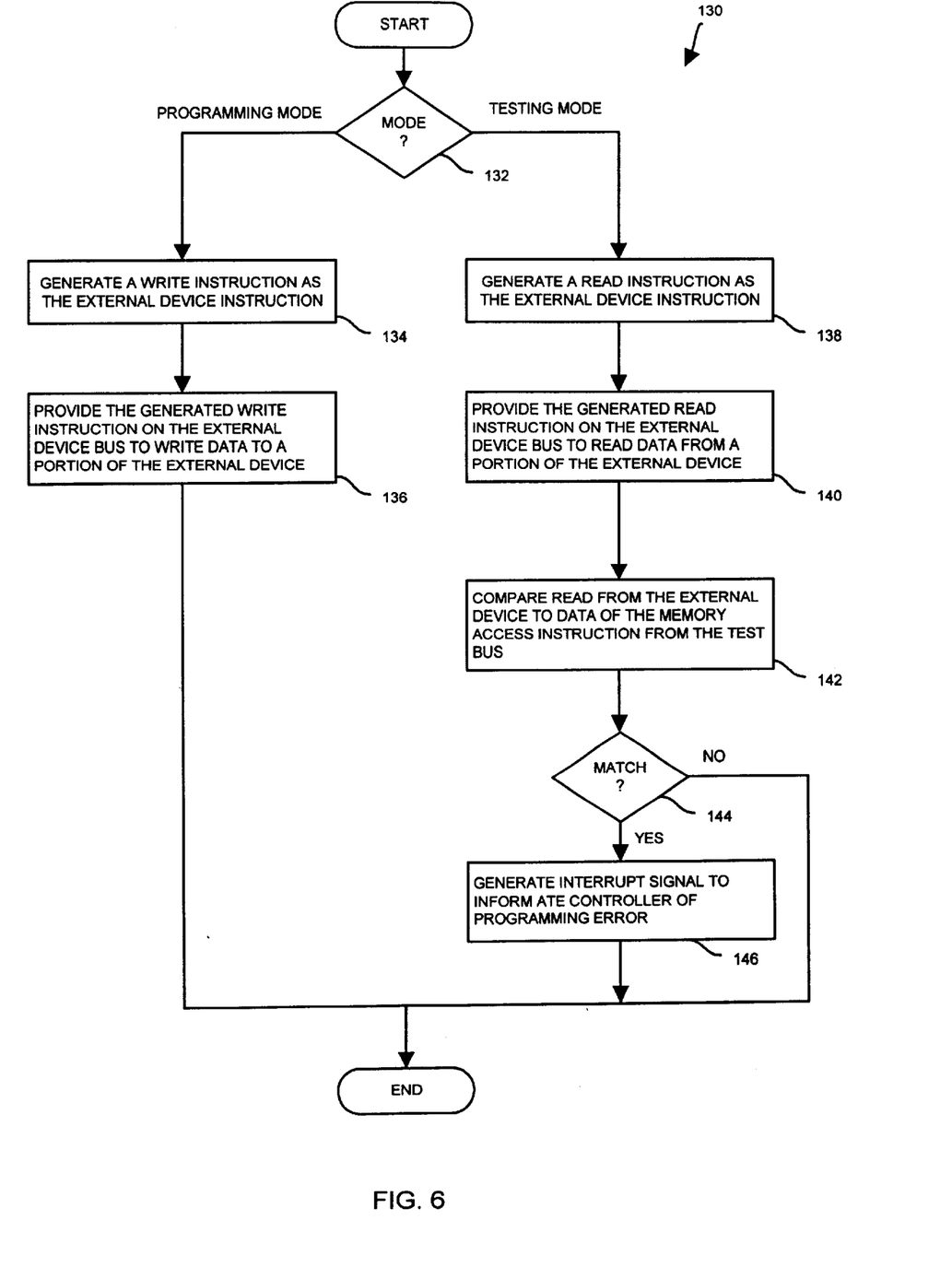
FIG. 6 shows a flow chart of a procedure for handling a WRITE memory access instruction as part of the procedure of FIG. 5.

It should be understood that WRITE operations typically require less bus bandwidth than read operations due to acknowledgement issues which are built into the bus protocol. In particular, WRITE operations typically get acknowledged before they are completed (i.e., write posting). In one arrangement of the invention, the ATE interfacing apparatus 24 responds to memory access instructions 74 having WRITE commands in different manners depending on the current operating mode in order to optimize utilization of the test bus 26. To this end, FIG. 6 shows a procedure 130 which is suitable for use as at least part of step 108 of FIG. 4. The procedure 130 involves receiving a memory access instruction 74 having a WRITE command, and writing data to the external device 30 when the ATE interfacing apparatus is in programming mode, but reading data from the external device 30 when the ATE interfacing apparatus 24 is in test mode.

In step 132 of FIG. 6, if the ATE interfacing apparatus 24 is in programming mode, the ATE interfacing apparatus 24 proceeds to steps 134 and 136. However, if the ATE interfacing device 24 is in test mode, the ATE interfacing apparatus 24 proceeds to steps 138 through 146.

In step 134, in which the ATE interfacing apparatus 24 is in programming mode, the translator 40 generates a WRITE instruction as the external device instruction 84 for accessing the external device 30. In particular, the address sequencer 90 translates the test bus address 78 of the memory access instruction 74 into an external device address, i.e., the identifier. For example, if the device to be accessed is word addressable rather than byte addressable, an offset may need to be added to the test bus address 78 and/or some of the address bit may need to be shifted to properly generate the external device address. Additionally, the data sequencer 92 rearranges the data if necessary to accommodate any width or format differences between the test bus 26 and the external device bus 50.

In step 136, the translator 40 provides the WRITE instruction to the external device bus 50 of the external device 30 through the external device interface 42. In particular, the translator 40 accesses a location of the external device 30 based on the external device address of the WRITE instruction (i.e., the external device instruction 84). The procedure 130 then terminates.

In step 138, in which the ATE interfacing apparatus 24 is in testing mode, the translator generates a read instruction as the external device instruction 84. In particular, the address sequencer 90 translates the test bus address 78 of the memory access instruction 74 into an external device address, i.e., the identifier. Furthermore, the data sequencer 92 rearranges the data if necessary to accommodate any width or format differences between the test bus 26 and the external device bus 50.

In step 140, the translator 40 provides a READ instruction to the external device bus 50 of the external device 30 through the external device interface 42. In particular, the translator 40 accesses a location of the external device based on the external device address of the READ instruction (i.e., the external device instruction 84).

In step 142, the translator 40 records response signals from the external device 30 in response to the READ instruction. The translator 40 then compares data within the response to the data from the data sequencer 92 (i.e., expected data).

In step 144, if the data read from the external device 30 matches the data from the data sequencer 92 (i.e., the expected data), the procedure 140 terminates. However, if the data read from the external device 30 is different than the data from the data sequencer 92, step 144 proceeds to step 146.

In step 146, the interrupt generator 94 of the translator 40 sends an interrupt to the ATE controller 22 notifying the ATE controller 22 that the ATE interfacing apparatus 24 has detected an error. The ATE controller 22 can then perform additional operations to correct the error and restart the instruction pipeline, or to identify the cause of the error if the error cannot be corrected.

Figure 7:
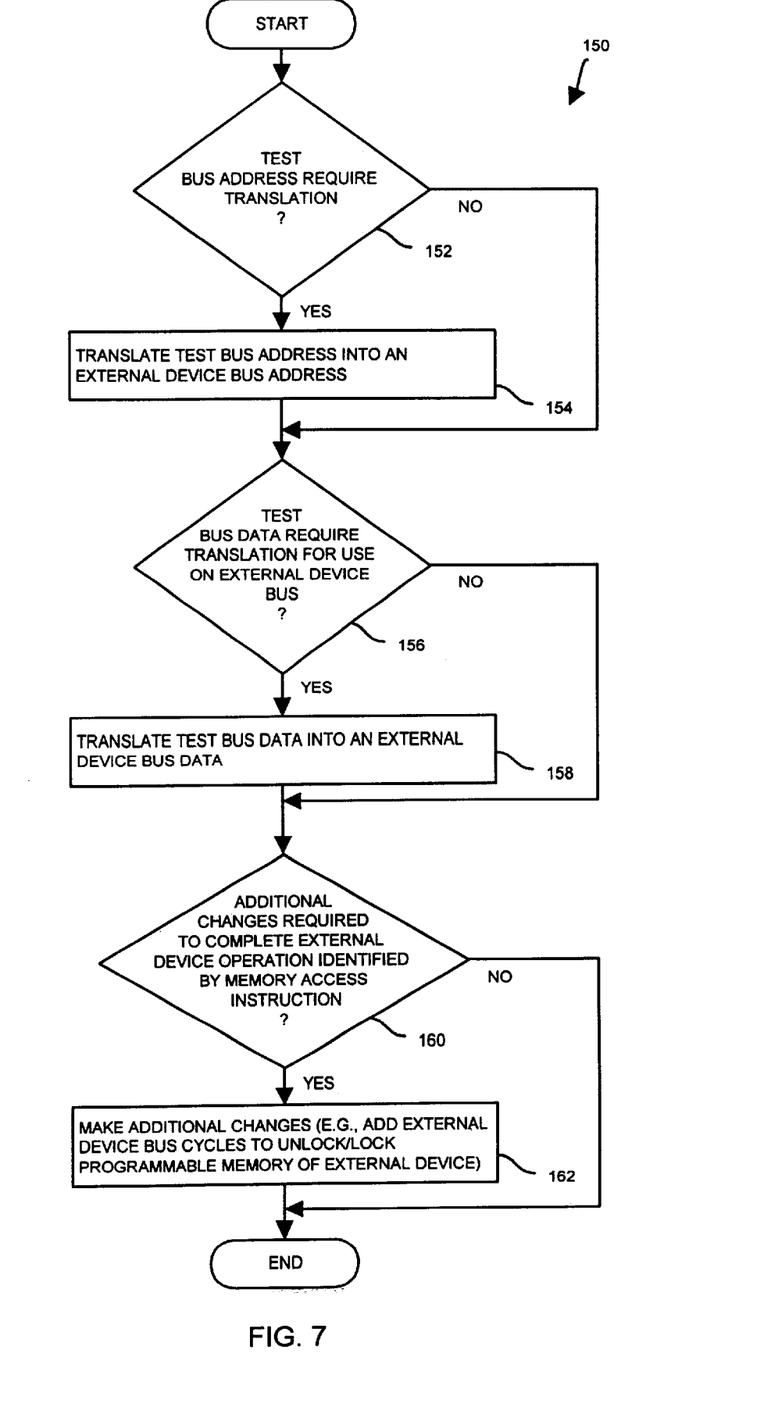
FIG. 7 shows a flow chart of a procedure for generating an external device instruction as part of the procedure of FIG. 5.

FIG. 7 shows a procedure 150 for generating an external device instruction 84 from a memory access instruction 74 which is suitable for use as either step 134 or step 138 of FIG. 6. In step 152, the translator 40 determines whether the test bus address 78 of the memory access instruction 74 requires translation (e.g., based on the control registers 114). If so, step 152 proceeds to step 154. If not, step 152 proceeds to step 156.

In step 154, the translator 40 translates the test bus address 78 into an external device bus address. In particular, the address sequencer 90 maps the test bus address to an external device address based on a translation routine from the library 44 (e.g., adding an address offset, shifting address bits, etc.).

In step 156, the translator 40 determines whether the data 80 of the memory access instruction 74 requires translation (e.g., based on the control registers 88). If so, step 156 proceeds to step 158. If not, step 156 proceeds to step 160.

In step 158, the translator 40 translates the data 80 into external device data. In particular, the data sequencer 92 arranges the data 80 to the external device data based on a translation routine from the library 44 (e.g., partitioning the data to use more bus cycles, padding portions of the data field, etc.).

In step 160, the translator 40 determines whether additional changes are required to complete a particular operation of the external device 30 (e.g., based on the control registers 114). For example, some older FLASH memories require additional bus cycles to perform an UNLOCK sequence when being programmed with data. If additional changes are required, step 160 proceeds to step 162. Otherwise, the procedure 160 terminates.

In step 162, the translator 40 makes the additional required changes such as by adding bus cycles to the external device instruction 84 or providing multiple external device instructions 84.

Figure 8:
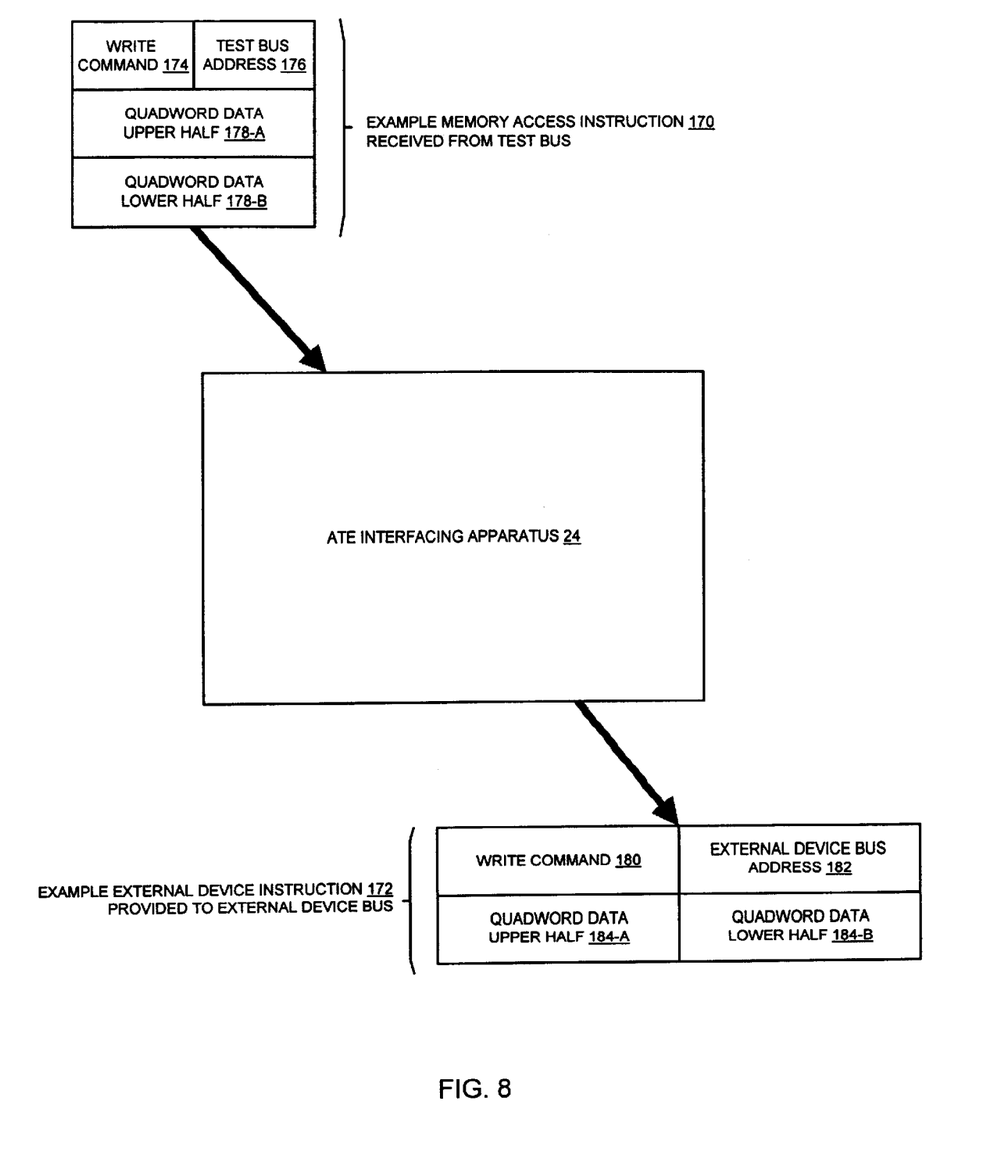
FIG. 8 shows, by way of example only, a block diagram of a memory access instruction and an external device instruction which are suitable for use by an interfacing apparatus of FIG. 1.

Further details of the invention will now be provided by way of the following example and with reference to FIG. 8. In this example, the ATE interfacing apparatus 24 receives a memory access instruction 170 and generates an external device instruction 172.

First, suppose that the ATE interfacing apparatus 24 has passed selftest (step 102, also see FIG. 4), been directed by the ATE controller 22 to access an FPGA device of the external device 30 in programming mode (step 104), and has configured itself to handle memory access instructions 74 in programming mode in response to such direction (step 106).

Further suppose that the ATE interfacing apparatus 24 receives a memory access instruction 170, as shown in FIG. 8. The memory access instruction 170 includes a WRITE command 174, a test bus address 176, and data 178. The data 178 is a quadword having an upper half 178-A and a lower half 178-B. The ATE interfacing apparatus 24 receives the memory access instruction 170 over three test bus cycles.

Upon receipt, the ATE interfacing apparatus 24 determines whether the memory access instruction 170 is intended for the external device 30. In particular, the control logic 86 within the translator 40 compares the test bus address 176 to the external device address space 64 (as defined by the control registers 88). If the test bus address 176 is within the external address space 64, the address and data sequencers 90, 92 translate the test bus address 176 and data 178 into an external device bus address and external device data.

Suppose that the ATE interfacing apparatus 24 has determined that the memory access instruction is intended for the external device 30 because the test bus address 176 is within the external address space 64. Accordingly, the ATE interfacing apparatus 24 generates the external device instruction 172.

The external device instruction 172 includes a WRITE command 180, an external device address 182, and data 184. The external device instruction 172 includes a WRITE command 180 rather than a READ command because the memory access instruction 170 included a WRITE command and further because the ATE interfacing apparatus 24 is in programming mode. (Recall that one arrangement of the invention generates a READ command in response to a WRITE command in testing mode.) The external device address 182 is a result of the address sequencer 90 applying a translation routine to convert the test bus address 176 into an appropriate address for the external device bus 50. In some situations, this may have involved shifting address bits or adding an offset, etc.

Furthermore, the data 184 includes a quadword upper half 184-A and a quadword lower half 184-B. The data sequencer 92 generates the quadword data 184 of the external device instruction 172 from the quadword data 178 of the memory access instruction 170. In some situations, this may have involved splitting the data 178 into smaller portions (data multiplexing), padding data, etc. As shown in FIG. 8, the quadword data 184 uses only one external device bus cycle (data de-multiplexing).

As shown in FIG. 8, the external device bus 50 is wide enough to enable the external device instruction 172 to use only two external device bus cycles. Accordingly, in response to the memory access instruction 170, the ATE interfacing apparatus 24 generates an optimized external device instruction 172 to access the external device 30 (step 108).

As described above, the invention is directed to techniques for accessing an external device using memory access instructions between an ATE controller 22 and an ATE interfacing apparatus 24. The use of such instructions results in only a few instructions and data exchanged between the ATE controller 22 and ATE interfacing apparatus 24, and short overall programming and test times. Accordingly, the invention provides greater throughput over conventional ATE systems which are often bottlenecked by numerous low level instructions and data exchanged between an ATE controller and a tester or channel card. Furthermore, the use of memory access instructions enables ATE program and test developers to more easily develop ATE programming and testing procedures. The features of the invention may be particularly useful in computerized devices manufactured by Teradyne, Inc. of Boston, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the external coupler 28 can be something else other than a bed of nails. In other arrangements, the external coupler 28 is a cable, connector, bus adapter, or the like.

Additionally, it should be understood that there is no requirement that the local memory address space 62 and the external device address space 64 be contiguous. Rather, one address space can separate another, e.g., they can be interleaved.

Furthermore, it should be understood the ATE system 20 can include multiple ATE interfacing apparatus 24 (see ellipses in FIG. 1). In one arrangement, each ATE interfacing apparatus 24 can use the same external device address space 64 in order to allow multiple external devices to be programmed simultaneously with the same data. In another arrangement, the external device address space 64 can be partitioned (e.g., by adjusting respective control registers 88 of the ATE interfacing apparatus 24) such that each ATE interfacing apparatus 24 has a unique portion of the external device address space. Moreover, it is not necessary that each ATE interfacing apparatus 24 program and/or test the same type of external device 30. These multiple ATE interfacing apparatus arrangements enable greater throughput for the ATE system 20 as a whole.

Additionally, it should be understood that the features of the invention can be combined with other conventional mechanisms and approaches (e.g., within an improved channel card). One such conventional mechanism which can be incorporated within the ATE interfacing apparatus 24 is JTAG serial programming.

Furthermore, it should be understood that the ATE interfacing apparatus 24 is capable of handling block mode data transfers to make efficient use of the test bus 26. The ATE controller 22 can send, in a single memory access instruction, a block of data to the ATE interfacing apparatus 24. If the external device bus is capable of block mode transfers, and if the proper translation routines are available, the ATE interfacing apparatus 24 can translate the single memory access instruction into a single external device instruction (an external device block instruction). Otherwise, the translator 40 of the ATE interfacing apparatus 24 generates multiple smaller external device instructions 84 for accessing the external device 30.

Additionally, it should be understood that a variety of bus types are suitable for use as the test bus 26. Such types include VXI, PCI, VME, VERSA, SCSI, Ethernet, GPIB, CAN, etc.

What is claimed is:

1. An automatic test equipment interfacing apparatus, comprising:
   a test bus interface for connecting to a test bus of an automatic test system;
   an external device interface for connecting to an external device; and
   a translator, interconnected between the test bus interface and the external device interface, that (i) receives a memory access instruction from the test bus through the test bus interface, the memory access instruction including a command and a test bus address, (ii) translates the test bus address into an identifier which identifies a portion of the external device, and (iii) accesses the identified portion of the external device through the external device interface based on the command and the identifier.

2. The automatic test equipment interfacing apparatus of claim 1 wherein a memory address space of the automatic test system includes a local memory address space for addressing memory locations of a local memory of the automatic test system and an external device address space that is outside the local memory address space; and wherein the translator is configured to determine that the test bus address of the memory access instruction is within the external device address space prior to accessing the external device.

3. The automatic test equipment interfacing apparatus of claim 2 wherein the external device interface is connectable to an external device bus of the external device; and wherein the translator includes an address sequencer that generates, as the identifier which identifies the portion of the external device, an external device bus address based on the test bus address, the external device bus address addressing a memory location of the external device.

4. The automatic test equipment interfacing apparatus of claim 1 wherein the memory access instruction further includes data, wherein the external device interface is connectable to an external device bus of the external device, wherein the external device bus has a width that is different than that of the test bus, and wherein the translator includes a data sequencer that maps the data of the memory access instruction into a number of external device bus cycles that is different than a number of test bus cycles conveying the data to the automatic test equipment interfacing apparatus.

5. The automatic test equipment interfacing apparatus of claim 1 wherein the memory access instruction further includes data; wherein the translator selectively operates in one of a prograruning mode and a test mode; and wherein the command is a WRITE command which directs the translator to (i) write data into a memory location of the external device when the translator operates in the programming mode, and (ii) read data from a memory location of the external device and compare the read data to the data of the memory access instruction when the translator operates in the test mode.

6. The automatic test equipment interfacing apparatus of claim 5 wherein the translator includes an interrupt generator that generates an interrupt signal to a controller of the automatic test system through the test interface when the read data from the memory location of the external device and the data of the memory access instruction are different.

7. The automatic test equipment interfacing apparatus of claim 1 wherein the external device includes an external device bus; and wherein the translator is configured to access the identified portion of the external device by (i) providing, on the external device bus, an external device instruction having an external device bus address as the identifier, and (ii) selectively providing at least one supplemental external device instruction to the external device on the external device bus based on the command of the memory access instruction.

8. The automatic test equipment interfacing apparatus of claim 1 wherein the memory access instruction includes exactly one test bus address and further includes a block of data which the translator, in response to the memory access instruction, (i) receives from the test bus over multiple test bus cycles, and (ii) provides to the external device.

9. The automatic test equipment interfacing apparatus of claim 1 wherein the test bus interface, the translator and the external device bus interface operate in a pipeline manner to process multiple memory access instructions simultaneously.

10. The automatic test equipment interfacing apparatus of claim 1, further comprising:

a library of translation routines, the translator being configured to dynamically select among the translation routines of the library when processing multiple memory access instructions in order to access different portions of the external device in different manners.

11. In an automatic test system, a method for processing a memory access instruction, comprising the steps of:

receiving a memory access instruction having a command and a test bus address;

translating the test bus address into an identifier which identifies a portion of an external device; and accessing the identified portion of the external device based on the command and the identifier.

12. The method of claim 11 wherein a memory address space of the automatic test system includes a local memory address space for addressing memory locations of a local memory of the automatic test system and an external device address space that is outside the local memory address space; and wherein the method further comprises the step of:

prior to accessing the external device, determining that test bus address of the memory access instruction is within the external device address space.

13. The method of claim 12 wherein the external device includes an external device bus; and wherein the step of translating includes the step of:

generating, as the identifier which identifies the portion of the external device, an external device bus address based on the test bus address, the external device bus address addressing a memory location of the external device.

14. The method of claim 11 wherein the memory access instruction further includes data, wherein the step of receiving includes obtaining the memory access instruction from a test bus of the automatic test system, wherein the external device includes an external device bus having a width that is different than that of the test bus, and wherein the step of translating includes the step of:

mapping the data of the memory access instruction into a number of external device bus cycles that is different than a number of test bus cycles for receiving the data.

15. The method of claim 11 wherein the memory access instruction further includes data; wherein the command of the memory access instruction is a WRITE command; and wherein the method further comprises the step of:

prior to accessing the external device, selecting one of a programming mode and a test mode such that the step of accessing includes the step of (i) writing the data to a memory location of the external device when the programming mode is selected, and (ii) reading data from a memory location of the external device and comparing the read data to the data of the memory access instruction when the test mode is selected.

16. The method of claim 15, further comprising the step of:

generating an interrupt signal to a controller of the automatic test system when the read data from the memory location of the external device and the data of the memory access instruction are different.

17. The method of claim 11 wherein the external device includes an external device bus, and wherein the step of accessing includes the step of:

providing, on the external device bus, an external device instruction having an external device bus address as the identifier, and selectively providing at least one supplemental external device instruction on the external device bus based on the command of the memory access instruction.

18. The method of claim 11 wherein the memory access instruction includes exactly one test bus address and further includes a block of data; and wherein the step of receiving the memory access instruction includes obtaining the memory access instruction over multiple bus cycles.

19. The method of claim 11, further comprising the step of:

during the step of accessing the identified portion of the external device, translating another test bus address of another memory access instruction into another identifier which identifies another portion of the external device in order to process multiple memory access instructions simultaneously in a pipeline manner.

20. The method of claim 11 wherein the automatic test system includes a library of translation routines, and wherein the method further comprises the step of:

dynamically selecting among the translation routines of the library when processing multiple memory access instructions in order to access different portions of the external device in different manners.

21. A computer program product that includes a computer readable medium having code stored thereon for processing a memory access instruction, such that the code, when carried out by an interfacing device of an automatic test system having a test bus coupled to the interfacing device, causes the interfacing device to perform the steps of:

receiving a memory access instruction having a command and a test bus address;

translating the test bus address into an identifier which identifies a portion of an external device; and accessing the identified portion of the external device based on the command and the identifier.

22. The computer program product of claim 21 wherein the identifier which identifies the portion of the external device is an external device bus address which addresses a memory location of the external device through an external device bus of the external device.

23. An automatic test equipment interfacing apparatus, comprising:

a test bus interface for connecting to a test bus of an automatic test system;

an external device interface for connecting to an external device; and means for (i) receiving a memory access instruction from the test bus through the test bus interface, the memory access instruction including a command and a test bus address, (ii) translating the test bus address into an identifier which identifies a portion of the external device, and (iii) accessing the identified portion of the external device through the external device interface based on the command and the identifier.

24. The automatic test equipment interfacing apparatus of claim 23 wherein the identifier which identifies the portion of the external device is an external device bus address which addresses a memory location of the external device through an external device bus of the external device.

25. An automatic test system, comprising:

a controller that provides a memory access instruction having a command and a test bus address;

an interfacing apparatus for accessing an external device; and a test bus which connects the controller with the interfacing apparatus, wherein the interfacing apparatus (i) receives the memory access instruction from the controller through the test bus, (ii) translates the test bus address into an identifier which identifies a portion of the external device, and (iii) accesses the identified portion of the external device based on the command and the identifier.

26. The automatic test system of claim 25 wherein the identifier which identifies the portion of the external device is an external device bus address which addresses a memory location of the external device through an external device bus of the external device.

* * * * *

UNITED STATES PATENT AND TRADEMARK OFFICE
CERTIFICATE OF CORRECTION

PATENT NO.    : 6,622,272 B1                                          Page 1 of 1
DATED         : September 5, 2003
INVENTOR(S)   : Weng F. Lee et al.

It is certified that error appears in the above-identified patent and that said Letters Patent is hereby corrected as shown below:

Column 2,
Line 26, change "upon a-fixed" to -- upon a fixed --;

Column 3,
Line 62, change "If this, is" to -- If this is --; and

Column 9,
Line 24, change "operation is-to" to -- operation is to --.

Signed and Sealed this

Twenty-eighth Day of October, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,622,272 B1 Page 1 of 1
DATED : September 16, 2003
INVENTOR(S) : Bernhard K. Haverkamp and Lik Seng Lim It is certified that error appears in the above-identified patent and that said Letters Patent is hereby corrected as shown below:

<u>Column 14,</u>
Line 33, "prograruning" should read -- programming --.

Signed and Sealed this

Thirtieth Day of March, 2004

JON W. DUDAS
*Acting Director of the United States Patent and Trademark Office*